United States Patent [19]
Shoji

[11] Patent Number: 5,283,793
[45] Date of Patent: Feb. 1, 1994

[54] LASER BEAM RECORDING APPARATUS
[75] Inventor: Takashi Shoji, Kanagawa, Japan
[73] Assignee: Fuji Photo Film Co., Ltd., Kanagawa, Japan
[21] Appl. No.: 987,814
[22] Filed: Dec. 9, 1992
[30] Foreign Application Priority Data
Dec. 17, 1991 [JP] Japan ............... 3-333479
[51] Int. Cl.⁵ .................................. H01S 3/10
[52] U.S. Cl. ........................ 372/24; 372/29; 372/26; 372/31; 372/38
[58] Field of Search ............ 372/24, 29, 26, 31, 372/38

[56] References Cited
U.S. PATENT DOCUMENTS
4,849,980 7/1989 Shoji et al. ............... 372/29

FOREIGN PATENT DOCUMENTS
59-9086 2/1984 Japan.
0200319 8/1989 Japan .................. 372/24
0235913 9/1989 Japan .................. 372/24
0054514 3/1999 Japan .................. 372/24

Primary Examiner—Georgia Y. Epps
Attorney, Agent, or Firm—Sughrue, Mion, Zinn, Macpeak & Seas

[57] ABSTRACT

A laser beam recording apparatus is provided with a semiconductor laser for producing a laser beam, and a beam scanning system for scanning the laser beam on a photosensitive material. A laser operation control circuit produces a light emission level instructing signal corresponding to an image signal and controls a drive current for the semiconductor laser over a natural light emission region and a laser oscillation region on the basis of the light emission level instructing signal, thereby to modulate the intensity of the laser beam. A device superimposes a radio-frequency current upon the drive current for the semiconductor laser only in a region in which the drive current exceeds a predetermined value.

2 Claims, 3 Drawing Sheets

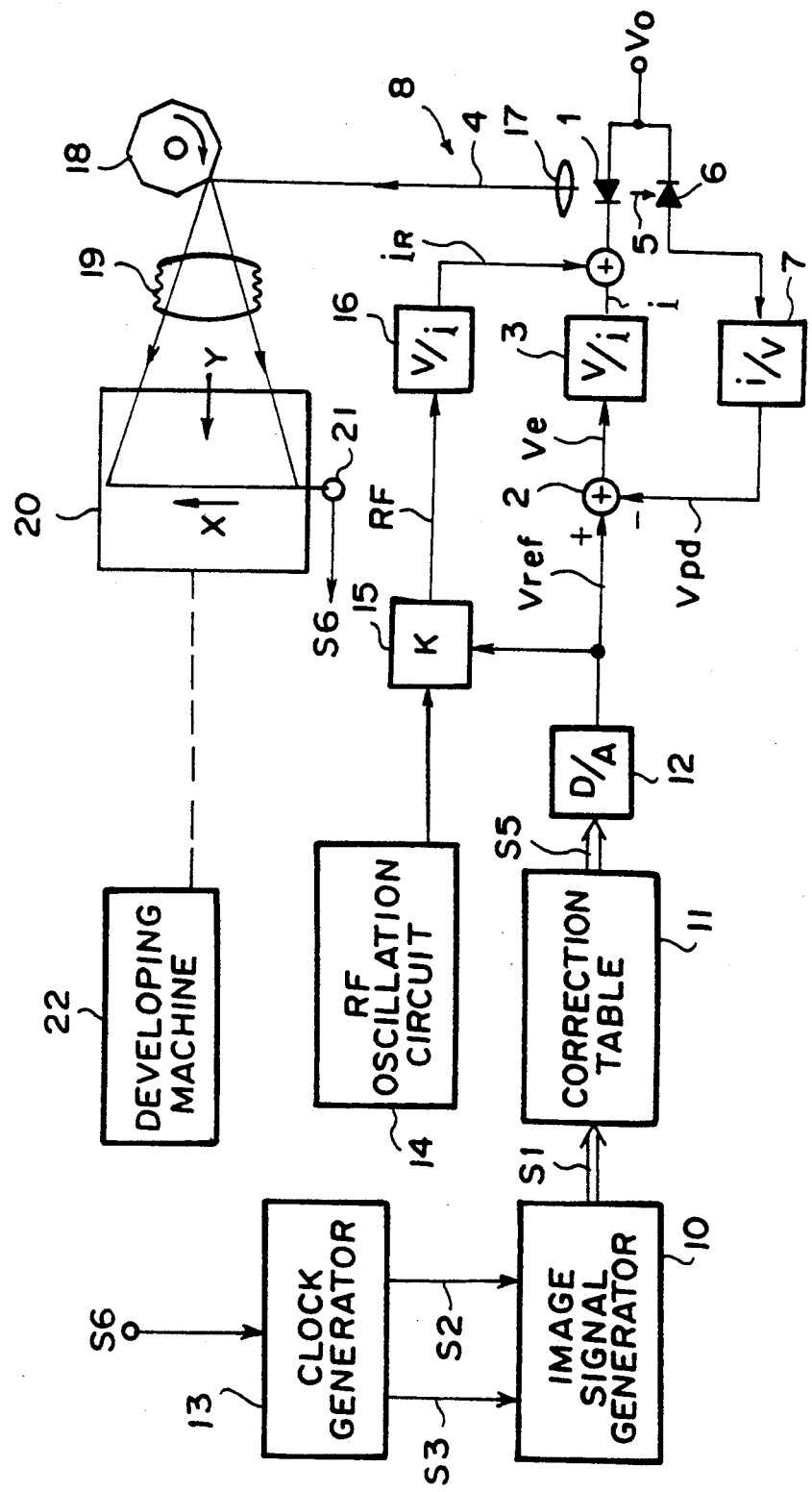
F I G. 1

FIG. 4

LASER BEAM RECORDING APPARATUS

BACKGROUND OF THE INVENTION

1. Field of the Invention

This invention relates to a laser beam recording apparatus for recording an image on a photosensitive material by scanning the photosensitive material with a laser beam modulated in accordance with an image signal.

2. Description of the Prior Art

Light beam scanning recording apparatuses, wherein a photosensitive material is scanned with a modulated light beam and an image is thereby recorded on the photosensitive material, have heretofore been used widely. As one of the means for producing a light beam in the light beam scanning recording apparatuses, a semiconductor laser has heretofore been used. A semiconductor laser has various advantages over a gas laser, or the like, in that the semiconductor laser is small in size, cheap and consumes little power, and in that the laser beam can be modulated directly by the drive current applied thereto.

FIG. 2 is a graph showing the optical output characteristics of an ordinary semiconductor laser with respect to the drive current. With reference to FIG. 2, the optical output characteristics of the semiconductor laser with respect to the drive current change sharply between a natural light emission region (LED region) and a laser oscillation region. Therefore, it is not always possible to apply the semiconductor laser to an operation for recording a continuous tone image. Specifically, in cases where intensity modulation is carried out by utilizing only the laser oscillation region, in which the optical output characteristics of the semiconductor laser with respect to the drive current are linear, it is possible to obtain a dynamic range of the optical output of only approximately 2 orders of ten at the most. As is well known, with a dynamic range of this order, it is impossible to obtain a continuous tone image having a high quality.

Accordingly, as disclosed in, for example, U.S. Pat. No. 4,849,980, it has been proposed to obtain a wide dynamic range of the optical output by controlling the drive current for a semiconductor laser over the natural light emission region and the laser oscillation region and thereby carrying out optical intensity modulation.

In general, the wavelength of a laser beam produced by a semiconductor laser fluctuates due to a change in the ambient temperature, or the like. Such a phenomenon is referred to as "mode hopping." If the mode hopping phenomenon occurs in a semiconductor laser, which is utilized as a source for producing recording light in a laser beam recording apparatus, the optical output of the semiconductor laser will fluctuate, and the image density of a recorded image will become non-uniform. Such a problem occurs due to various factors in cases where an automatic power control circuit (hereinafter referred to as an APC circuit) is provided. With the APC circuit, the intensity of a laser beam radiated rearwardly from the semiconductor laser (i.e., a laser beam radiated in a direction reverse to the direction along which the forwardly radiated laser beam to be used for the recording of an image is produced) is detected. Alternatively, the intensity of part of the forwardly radiated laser beam which has been separated from the main forwardly radiated laser beam by a beam splitter, or the like, and which serves as a monitor laser beam is detected. The drive current applied to the semiconductor laser is controlled such that the detected intensity may be kept at a predetermined value.

For example, if the mode hopping phenomenon occurs in cases where the rearwardly radiated laser beam is monitored, the ratio of the intensity of the rearwardly radiated laser beam to the intensity of the forwardly radiated laser beam will change. Therefore, in such cases, even if the drive current applied to the semiconductor laser is controlled such that the rearwardly radiated laser beam may become stable, the intensity of the forwardly radiated laser beam to be used for the recording of an image will vary before the mode hopping phenomenon occurred and after the mode hopping phenomenon occurred. Also, part of the monitor laser beam is reflected repeatedly between opposite surfaces of a cover glass of the photodetector of the APC circuit, and interference occurs between the repeatedly reflected monitor laser beam and the monitor laser beam which directly travels to the light receiving element without being reflected repeatedly. The state of the interference changes due to fluctuations in the wavelength of the laser beam which are caused by the mode hopping phenomenon. As a result, the amount of the laser beam received by the photodetector changes. In such cases, the intensity of the forwardly radiated laser beam fluctuates.

SUMMARY OF THE INVENTION

The primary object of the present invention is to provide a laser beam recording apparatus, wherein the image quality of a recorded image is not adversely affected by mode hopping of a semiconductor laser.

The present invention provides a laser beam recording apparatus provided with a semiconductor laser for producing a laser beam, a beam scanning system for scanning the laser beam on a photosensitive material, and a laser operation control circuit for producing a light emission level instructing signal corresponding to an image signal, and controlling a drive current for the semiconductor laser over a natural light emission region and a laser oscillation region on the basis of the light emission level instructing signal, thereby to modulate the intensity of the laser beam, wherein the improvement comprises the provision of a means for superimposing a radio-frequency current upon the drive current for the semiconductor laser only in a region in which the drive current exceeds a predetermined value.

The drive current for the semiconductor laser corresponds in one-to-one relation to the image signal. Therefore, the region in which the drive current exceeds the predetermined value is equivalent to a region in which the image signal exceeds a predetermined level.

When the radio-frequency current is superimposed upon the drive current for the semiconductor laser, the semiconductor laser oscillates in a multiple longitudinal mode, and therefore the mode hopping phenomenon is prevented. As a result, the problems can be prevented from occurring in that the image density of the recorded image becomes non-uniform due to fluctuations in the optical output due to the mode hopping phenomenon. Accordingly, a recorded image having good image quality can be obtained.

A technique for superimposing a radio-frequency current upon a drive current for a semiconductor laser is already known from, for example, Japanese Patent Publication No. 59(1984)-9086. However, the thing, to which the conventional technique for superimposing a radio-frequency current has heretofore been applied, is a constant output drive type of semiconductor laser which is used for optical pickup device, or the like. The conventional technique for superimposing a radio-frequency current has not heretofore been applied to a semiconductor laser, which is driven over both the natural light emission region and the laser oscillation region as in the present invention. This is because, if superimposition of a radio-frequency current is applied to a semiconductor laser, which is driven over both the natural light emission region and the laser oscillation region, an inverse current will flow through the semiconductor laser in a region in which the drive current is very small and, as a result, production of the laser beam will cease.

However, if superimposition of the radio-frequency current is carried out only in the region in which the drive current exceeds the predetermined value as in the present invention, it is possible to avoid the flow of an inverse current through the semiconductor laser. Also, mode hopping is the phenomenon that occurs in the laser oscillation region in which the drive current is comparatively large. Therefore, in order for the mode hopping phenomenon to be prevented, it is sufficient for superimposition of the radio-frequency current to be carried out only in the region in which the drive current exceeds the predetermined value.

As described above, with the laser beam recording apparatus in accordance with the present invention, basically, superimposition of the radio-frequency current may be carried out only in the laser oscillation region, in which the drive current exceeds a threshold current iT. Alternatively, superimposition of the radio-frequency current may be carried out only in a high emission region, in which the mode hopping phenomenon will occur particularly easily. The effects of preventing the mode hopping phenomenon can be obtained more reliably when the amplitude of the radio-frequency current is increased as the drive current for the semiconductor laser becomes larger by considering that, in a higher emission region, there is the tendency for the mode hopping phenomenon to occur more easily and there is less possibility for flow of an inverse current through the semiconductor laser due to superimposition of the radio-frequency current.

Also, in such cases, superimposition of the radio-frequency current may be begun from the state of the amplitude close to zero at a predetermined drive current value smaller than the threshold current iT. In such cases, the problems can be prevented from occurring in that the optical output of the semiconductor laser changes at the boundary between the region, in which the superimposition of the radio-frequency current is carried out, and the region, in which the superimposition of the radio-frequency current is not carried out, and in that, as a result, the image density of the recorded image changes sharply at positions corresponding to the aforesaid boundary.

BRIEF DESCRIPTION OF THE DRAWINGS

FIG. 1 is a schematic view showing a first embodiment of the laser beam recording apparatus in accordance with the present invention, FIG. 4 is a schematic view showing a second embodiment of the laser beam recording apparatus in accordance with the present invention.

DESCRIPTION OF THE PREFERRED EMBODIMENTS

Figure 2:
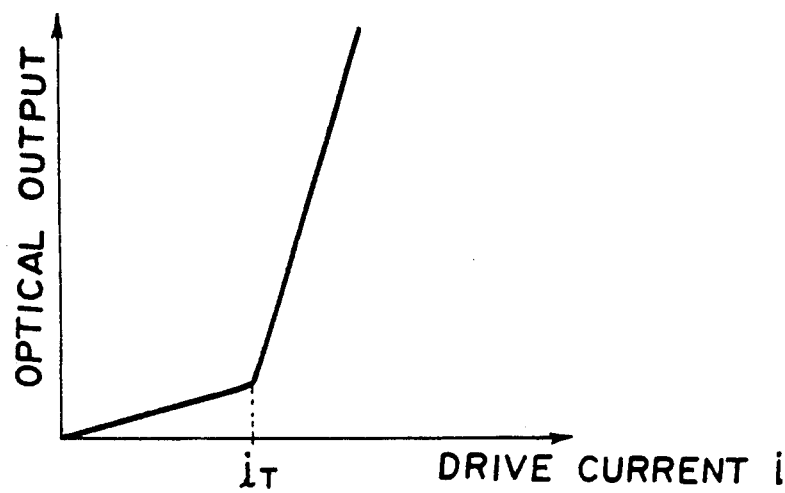
FIG. 2 is a graph showing optical output characteristics of an ordinary semiconductor laser with respect to a drive current.

The present invention will hereinbelow be described in further detail with reference to the accompanying drawings.

FIG. 1 is a schematic view showing a first embodiment of the laser beam recording apparatus in accordance with the present invention. With reference to FIG. 1, an image signal generator 10 generates an image signal S1 representing a continuous tone image. By way of example, the image signal S1 is a digital signal representing a continuous tone image of a density scale of 10 bits. The image signal generator 10 changes over the signal corresponding to a single main scanning line on the basis of a line clock S2, which will be described later. Also, the image signal generator 10 outputs the image signal S1 corresponding to each picture element in accordance with a picture element clock S3.

The image signal S1 is fed into a correction table 11 comprising a RAM, or the like, and subjected to gradation correction, an inverse logarithmic conversion, and a conversion process for eliminating nonlinearity of the optical output characteristics of a semiconductor laser with respect to a drive current. The image signal S1 is thereby converted into a light emission level instructing signal S5 of, for example, 16 bits. The light emission level instructing signal S5 is fed into a D/A converter 12, and is converted by the D/A converter 12 into a light emission level instructing signal Vref, which is composed of an analog voltage signal. The light emission level instructing signal Vref is fed into an addition point 2 of an APC circuit 8 and then into a voltage-to-current conversion amplifier 3. The voltage-to-current conversion amplifier 3 feeds a drive current, which is proportional to the light emission level instructing signal Vref, into a semiconductor laser 1. A laser beam 4 is produced by the semiconductor laser 1 and is radiated forwardly. The laser beam 4 is utilized to scan a photosensitive material by a beam scanning system, which will be described later.

A laser beam 5 is radiated rearwardly from the semiconductor laser 1. The intensity of the laser beam 5 is detected by a pin photodiode 6, which monitors the laser beam intensity and is located in a housing of the semiconductor laser 1. The intensity of the laser beam 5 thus detected is proportional to the intensity of the laser beam 4, which is utilized to record an image. The intensity of the laser beam 5, i.e., the output current of the photodiode 6 representing the intensity of the laser beam 4, is converted by a current-to-voltage conversion amplifier 7 into a feedback signal (a voltage signal) Vpd. The feedback signal Vpd is fed into the addition point 2. From the addition point 2, a deviation signal Ve is fed out which represents the amount of deviation between the light emission level instructing signal Vref and the feedback signal Vpd. The deviation signal Ve is converted by the voltage-to-current conversion amplifier 3 into a current, which drives the semiconductor laser 1. When control is thus effected, the intensity of the laser beam 5 can be kept at a predetermined value with respect to a predetermined level of the light emission level instructing signal Vref.

The laser beam 4 is collimated by a collimator lens 17, and is then reflected and deflected by a light deflector 18, which may be constituted of a polygon mirror, or the like. The laser beam 4, which has thus been deflected, is passed through a converging lens 19, which may normally be constituted of an fθ lens. The laser beam 4 is thereby converged into a minute spot on a photographic material 20 and caused to scan the photographic material 20 in a main scanning direction indicated by the arrow X. The photographic material 20 is moved by a movement means (not shown) in a sub-scanning direction indicated by the arrow Y, which direction is approximately normal to the main scanning direction X. The photographic material 20 is thus scanned with the laser beam 4 in the sub-scanning direction Y. In this manner, the photographic material 20 is two-dimensionally scanned with and exposed to the laser beam 4. Since the intensity of the laser beam 4 is modulated in accordance with the image signal S1 as mentioned above, the continuous tone image which the image signal S1 represents is recorded as a photographic latent image on the photographic material 20. Thereafter, the photographic material 20 is sent to a developing machine 22 and is subjected to a development process. In this manner, the continuous tone image is developed as a visible image on the photographic material 20.

When the laser beam 4 scans the photographic material 20, passage of the laser beam 4 over a start point of the main scanning is detected by a photodetector 21. A start point detection signal S6 is generated by the photodetector 21 and fed into a clock generator 13. The clock generator 13 outputs the aforesaid line clock S2 and the picture element clock S3 in synchronization with the timing, with which the start point detection signal S6 is fed thereinto.

Figure 3:
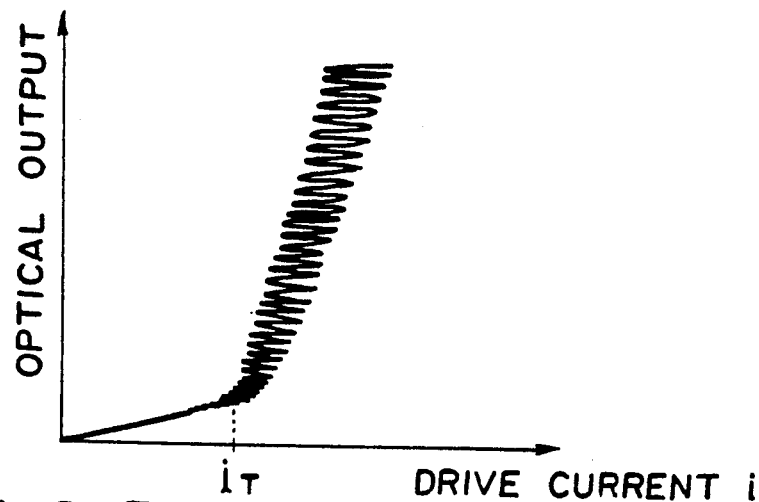
FIG. 3 is a graph showing optical output characteristics of a semiconductor laser, which is employed in the first embodiment, with respect to a drive current.

The direct drive current i for the semiconductor laser 1 is fed out of the voltage-to-current conversion amplifier 3 of the APC circuit 8. A radio-frequency current iR is superimposed upon the drive current i. The radio-frequency current iR is obtained by passing a radio-frequency signal (a voltage signal) RF, which has been fed out of a radio-frequency oscillation circuit 14, through a variable gain circuit 15 and a voltage-to-current conversion amplifier 16. The frequency of the radio-frequency current iR falls within the range of, for example, several hundreds of megahertz to 1GHz. The variable gain circuit 15 receives the light emission level instructing signal Vref corresponding to the semiconductor laser drive current i and increases the gain in accordance with an increase in the level of the light emission level instructing signal Vref. In this manner, as illustrated in FIG. 3, superimposition of the radio-frequency current iR upon the drive current i is begun from a point slightly lower than a threshold current iT. The amplitude of the radio-frequency current iR becomes larger as the drive current i increases.

When the radio-frequency current iR is superimposed upon the semiconductor laser drive current i, the semiconductor laser 1 oscillates in a multiple longitudinal mode. Therefore, the mode hopping phenomenon is restricted. As a result, fluctuations in the optical output of the semiconductor laser 1 due to the mode hopping phenomenon can be eliminated, and the image density of the recorded image is prevented from becoming non-uniform. Also, because the amplitude of the radio-frequency current iR is changed in the manner described above, the problems can be prevented from occurring in that the optical output of the semiconductor laser 1 changes sharply at the boundary between the region, in which the superimposition of the radio-frequency current iR is carried out, and the region, in which the superimposition of the radio-frequency current iR is not carried out. As a result, the image density of the recorded image does not change sharply at positions corresponding to the aforesaid boundary. Also, flow of an inverse current through the semiconductor laser 1 can be avoided.

Figure 4:
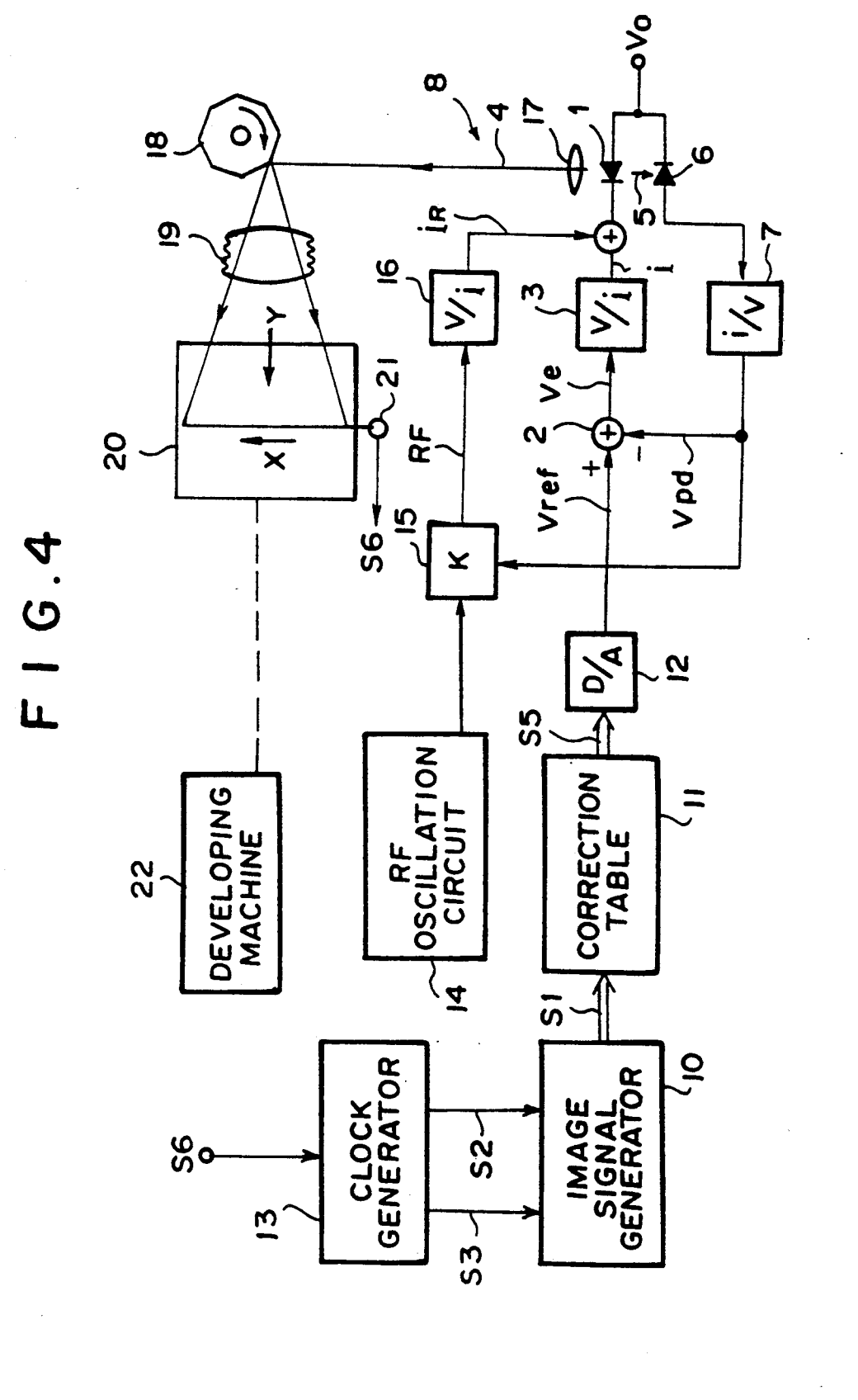

A second embodiment of the laser beam recording apparatus in accordance with the present invention will be described hereinbelow with reference to FIG. 4. In FIG. 4, similar elements are numbered with the same reference numerals with respect to FIG. 1.

In the second embodiment, the feedback signal Vpd is fed into the variable gain circuit 15. The variable gain circuit 15 increases the gain as the value of the feedback signal Vpd becomes larger. In the same manner as that for the light emission level instructing signal Vref, the value of the feedback signal Vpd becomes larger as the semiconductor laser drive current i increases. Therefore, basically, the amplitude of the radio-frequency current iR superimposed upon the drive current i changes in the same manner as that in the first embodiment.

Figure 5:
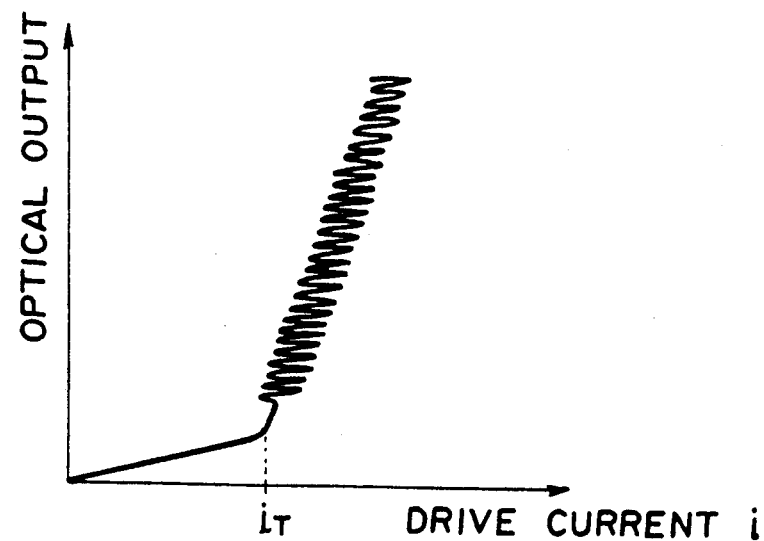
FIG. 5 is a graph showing a different example of optical output characteristics of a semiconductor laser, which is employed in the laser beam recording apparatus in accordance with the present invention, with respect to a drive current.

The amplitude of the radio-frequency current iR need not necessarily be changed continuously as in the first and second embodiments. Specifically, as illustrated in FIG. 5, the amplitude of the radio-frequency current iR may be kept constant. Also, as shown in FIG. 5, the radio-frequency current iR may be superimposed upon the drive current i only in the region in which the drive current i exceeds the threshold current iT.

Additionally, in the aforesaid embodiments, superimposition of the radio-frequency current iR upon the semiconductor laser drive current i is controlled in accordance with the value of the drive current i. The drive current i corresponds in one-to-one relation to the image signal S1. Therefore, such control is equivalent to controlling the superimposition of the radio-frequency current iR in accordance with the value of the image signal S1. In the laser beam recording apparatus in accordance with the present invention, the superimposition of the radio-frequency current iR may be controlled directly in accordance with the image signal.

What is claimed is:

1. A laser beam recording apparatus provided with a semiconductor laser for producing a laser beam, a beam scanning system for scanning the laser beam on a photosensitive material, and a laser operation control circuit for producing a light emission level instructing signal corresponding to an image signal, and controlling a drive current for the semiconductor laser over a natural light emission region and a laser oscillation region on the basis of the light emission level instructing signal, thereby to modulate the intensity of the laser beam, wherein the improvement comprises the provision of a means for superimposing a radio-frequency current upon the drive current for the semiconductor laser only in a region in which the drive current exceeds a predetermined value.

2. An apparatus as defined in claim 1 wherein said means for superimposing the radio-frequency current upon the drive current for the semiconductor laser increases an amplitude of the radio-frequency current as the drive current for the semiconductor laser becomes larger.

* * * * *